(12) United States Patent  
Han et al.

(10) Patent No.: US 9,864,025 B2  
(45) Date of Patent: *Jan. 9, 2018

(54) MAGNETIC RESONANCE IMAGING SYSTEMS FOR PARALLEL TRANSMIT, RECEIVE AND SHIM AND METHODS OF USE THEREOF

(71) Applicant: Duke University, Durham, NC (US)

(72) Inventors: Hui Han, Durham, NC (US); Trong-Kha Truong, Durham, NC (US); Allen W. Song, Chapel Hill, NC (US)

(73) Assignee: Duke University, Durham, NC (US)

(*) Notice: Subject to any disclaimer, the term of this patent is extended or adjusted under 35 U.S.C. 154(b) by 1193 days.

This patent is subject to a terminal disclaimer.

(21) Appl. No.: 13/898,993

(22) Filed: May 21, 2013

(65) Prior Publication Data

US 2014/0002084 A1   Jan. 2, 2014

Related U.S. Application Data

(60) Provisional application No. 61/665,517, filed on Jun. 28, 2012.

(51) Int. Cl.  
*G01R 33/3875* (2006.01)  
*G01R 33/341* (2006.01)  
(Continued)

(52) U.S. Cl.  
CPC ..... *G01R 33/3642* (2013.01); *G01R 33/3628* (2013.01); *G01R 33/3875* (2013.01);  
(Continued)

(58) Field of Classification Search  
USPC ................ 324/300–322; 600/307–435; 382/128–131  
See application file for complete search history.

(56) References Cited

U.S. PATENT DOCUMENTS 4,881,034 A   11/1989   Kaufman et al.  
5,359,289 A   10/1994   Van Der Meulen  
(Continued)

FOREIGN PATENT DOCUMENTS

WO   WO 2011/065532 A1   6/2011  
WO   WO 2011/122084 A1   10/2011  
WO   WO 2014/088941 A1   6/2014

OTHER PUBLICATIONS

Biber et al., Design of a Local Shim Coil to Improve B0 Homogeneity in the Cervical Spine Region, Proc. Intl. Soc. Mag. Reson. Med., 2012, p. 2746, vol. 20.

(Continued)

*Primary Examiner* — Melissa Koval  
*Assistant Examiner* — Tiffany Fetzner  
(74) *Attorney, Agent, or Firm* — Myers Bigel, P.A.

(57) ABSTRACT

MRI systems with a new concept and hardware modality configured for parallel transmit, receive, and shim to address $B_0$ and $B_1$ inhomogeneity, both of which increase with field strength. This invention benefits from a number of advantages over existing technologies: it can save valuable space within the MRI magnet bore, largely reduce the manufacturing cost of MRI scanners, and avoid the electromagnetic interference issue associated with existing technologies.

20 Claims, 5 Drawing Sheets  
(3 of 5 Drawing Sheet(s) Filed in Color)

(51) Int. Cl.
G01R 33/36 (2006.01)
G01R 33/345 (2006.01)
G01R 33/565 (2006.01)

(52) U.S. Cl.
CPC ........ G01R 33/341 (2013.01); G01R 33/3453 (2013.01); G01R 33/3635 (2013.01); G01R 33/3657 (2013.01); G01R 33/5659 (2013.01)

(56) References Cited

U.S. PATENT DOCUMENTS

| | | | |
|---|---|---|---|
| 6,023,167 | A | 2/2000 | Demeester et al. |
| 6,081,120 | A | 6/2000 | Shen |
| 6,879,159 | B2 | 4/2005 | Yoshida |
| 7,598,739 | B2 | 10/2009 | Vaughan, Jr. et al. |
| 7,800,368 | B2 | 9/2010 | Vaughan et al. |
| 2004/0012391 | A1 | 1/2004 | Vaughan, Jr. et al. |
| 2008/0211501 | A1 | 9/2008 | Graesslin et al. |
| 2011/0156704 | A1 | 6/2011 | Boernert et al. |
| 2011/0309832 | A1 | 12/2011 | Alagappan et al. |
| 2012/0139541 | A1 | 6/2012 | Weiss et al. |
| 2014/0002084 | A1* | 1/2014 | Han ................ G01R 33/3628 324/322 |
| 2015/0177344 | A1* | 6/2015 | Han ................ G01R 33/3628 324/322 |
| 2016/0116556 | A1* | 4/2016 | Darnell ............ G01R 33/3875 324/322 |

OTHER PUBLICATIONS

Han et al., Integrated Parallel Reception, Excitation, and Shimming (iPRES), Magnetic Resonance in Medicine, 2013, pp. 241-247, vol. 70.
Stockmann et al., Combined shim-RF array for highly efficient shimming of the brain at 7 Tesla, Proc. Intl. Soc. Mag. Reson. Med., 2013, p. 0665, vol. 21.
Truong et al., Integrated RF/shim coil array for parallel reception and localized $B_0$ shimming in the human brain, NeuroImage, 2014, pp. 235-240, vol. 103.
Graessl et al. "Design, evaluation and application of a modular 32 channel transmit/receive surface coil array for cardiac MRI at 7T", Proceedings of the ISMRM 20$^{th}$ Annual Meeting, Melbourne, 2012, p. 305.
International Preliminary Report on Patentability Corresponding to International Application No. PCT/US2013/042020; dated Jan. 8, 2015; 16 Pages.
Bernstein et al. "Imaging Artifacts at 3.0T", Journal of Magnetic Resonance Imaging, 24:735-746, 2006.
Blamire, "The Technology of MRI—the next 10 years?", The British Journal of Radiology, 81, 2008, 601-617.
de Graaf et al. "Dynamic Shim Updating (DSU) for Multislice Signal Acquisition", Magn Reson Med, 49:409-416, 2003.
Golay, "Field Homogenizing Coils for Nuclear Spin Resonance Instrumentation", Review of Scientific Instruments, 29, 313, 1958.
Graessl et al. "Desing, evaluation and application of a modular 32 channel transmit/receive surface coil array for cardiac MRI at 7T", Journal of Cardiovascular Magnetic Resonance, 2013, 15(Suppl 1):W2.
Ha et al. "A PIN diode controlled dual-tuned MRI RF coil and phased array for multi nuclear imaging", Phys. Med. Biol., 55;2589-2600, 2010.
Horowitz et al. The Art of Electronics—2$^{nd}$ Edition, Cambridge University Press, 1989, 1041 pages.
International Search Report and Written Opinion Corresponding to International Application No. PCT/US2013/042020; dated Oct. 11, 2013; 18 Pages.
Juchem et al. "Dynamic Multi-Coil Shimming of the Human Brain at 7 Tesla", J Magn Reson. 212(2): 280-288, Oct. 2011.
Juchem et al. "Magnetic Field Modeling with a Set of Individual Localized Coils", J Magn Reson., Jun. 2010; 204(2):281-289.
Juchem et al. "Multicoil Shimming of the Mouse Brain", Magn Reson Med, 66:893-900, 2011.
Koch et al. "Optimization of static magnetic field homogeneity in the human and animal brain in vivo", Prog Nucl Magn Reson Spectrosc., Feb. 1, 2009; 54(2): 69-96.
Kraff et al. "An eight-channel transmit/receive multipurpose coil for musculoskeletal MR imaging at 7 T", Med Phys., Dec. 2010:37(12):6368-76.
Pan et al. "Role of Very High Order and Degree $B_0$ Shimming for Spectroscopic Imaging of the Human Brain at 7 Tesla", Magn Reson Med, 68:1007-1017, 2012.
Romeo et al. "Magnet field profiling: analysis and correcting coil design", Magn Reson Med., Mar. 1984:1(1):44-65.
Setsompop et al. "Parallel RF Transmission With Eight Channels at 3 Tesla", Magn Reson Med., 56:1163-1171, 2006.
Vaughan et al. "9.4T Human MRI: Preliminary Results", Magn Reson Med., 56:1274-1282, 2006.
Wiesinger F., Parallel Magnetic Resonance Imaging: Potential and Limitations at High Fields, Ph.D. Thesis. Zurich: Swiss Federal Institute of Technology. 2005, 146 pages.
Wiggins et al. "32-Channel 3 Tesla Receive-Only Phased-Array Head Coil With Soccer-Ball Element Geometry", Magn Reson Med., 56:216-223, 2006.
Wilson et al. "Optimization of Static Field Homogeneity in Human Brain Using Diamagnetic Passive Shims", Magn Reson Med., 48:906-914, 2002.
Wright et al. "Theory and Application of Array Coils in MR Spectroscopy", NMR in Biomedicine, vol. 10, 394-410, 1997.
Zhang et al. "Magnetic resonance imaging of water content across the Nafion membrane in an operational PEM fuel cell", Journal of Magnetic Resonance, vol. 193, Issue 2, Aug. 2008, 259-266.

* cited by examiner

EPI IMAGES (5A,5B) AND B₀
MAPS (5C,5D) ACQUIRED WITH:

5A,5C: DC CURRENT= 0mA
5B,5D: DC CURRENT= 130mA

MEASURED (6A,6B) AND SIMULATED (6C,6D) B₀
MAPS GENERATED BY THE SINGLE-LOOP (6A,6C) AND
FIGURE-8 (6B,6D) COILS FOR A DC CURRENT OF 130 mA.

MAGNETIC RESONANCE IMAGING SYSTEMS FOR PARALLEL TRANSMIT, RECEIVE AND SHIM AND METHODS OF USE THEREOF

RELATED APPLICATIONS

This application claims priority to and the benefit of U.S. Provisional Application Ser. No. 61/665,517, filed Jun. 28, 2012, the contents of which are hereby incorporated by reference as if recited in full herein.

STATEMENT OF FEDERAL SUPPORT

This invention was made with government support under Grant No. R01 EB 009483 from the National Institutes of Health. The government has certain rights in the invention.

FIELD OF THE INVENTION

This invention relates to Magnetic Resonance Imaging.

BACKGROUND

In magnetic resonance imaging (MRI), an RF coil with a set of radiofrequency (RF) coils (coil array) or transverse electromagnetic (TEM) coil elements can be used to transmit and receive the signal in parallel through multiple channels. Such coils may further be used in combination with special acquisition and reconstruction techniques based on parallel transmit and/or receive to improve the homogeneity of the RF magnetic field $B_1$ (RF shimming or $B_1$ shimming) or to reduce the scan time (parallel imaging), respectively. See, e.g., U.S. Pat. Nos. 7,598,739 and 7,800,368, the contents of which are hereby incorporated by reference as if recited in full herein. In addition, a separate set of coils (shim coils) can be used to generate a non-uniform magnetic field designed to compensate for any inhomogeneities of the static magnetic field $B_0$ (active $B_0$ shimming). See, Juchem C, Brown P B, Nixon T W, McIntyre S, Boer V O, Rothman D L, de Graaf R A. Dynamic multi-coil shimming of the human brain at 7 T. J Magn Reson 2011; 212:280-288; and Pan et al., Role of very high order and degree $B_0$ shimming for spectroscopic imaging of the human brain at 7 Tesla, Mag. Res. In Med. 2011 Dec. 28, doi:10.1002/mrm.24122, the contents of which are hereby incorporated by reference as if recited in full herein.

SUMMARY OF EMBODIMENTS OF THE INVENTION

The present disclosure provides a new concept and hardware modality for integrated parallel transmit, receive, and shimming. The concept can be used to implement parallel transmit/receive (which can include $B_1$ shimming and/or parallel imaging capabilities) and $B_0$ shimming by employing the same set of localized coil elements or TEM coil elements, with each coil or TEM coil element working in both an RF mode (for transmit/receive) and a direct current (DC) mode (for $B_0$ shimming) simultaneously. With an appropriate coil design, both an RF and a DC current can flow in the same coil element simultaneously but independently without electromagnetic interference between the two modes.

Embodiments of the invention can be used when the same RF coil array is used for parallel transmit and receive, and also when two or more separate coil arrays are used. In the latter case, the $B_0$ shimming capability can be integrated into each coil array and at least some, typically all, coil elements from both arrays can be used together for $B_0$ shimming, resulting in a large number of degrees of freedom.

It is noted that aspects of the invention described with respect to one embodiment, may be incorporated in a different embodiment although not specifically described relative thereto. That is, all embodiments and/or features of any embodiment can be combined in any way and/or combination. These and other objects and/or aspects of the present invention are explained in detail in the specification set forth below.

The foregoing and other objects and aspects of the present invention are explained in detail herein.

BRIEF DESCRIPTION OF THE DRAWINGS

The patent or application file contains at least one drawing executed in color. Copies of this patent or patent application publication with color drawings will be provided by the Office upon request and payment of the necessary fee.

DETAILED DESCRIPTION

Figure 1:
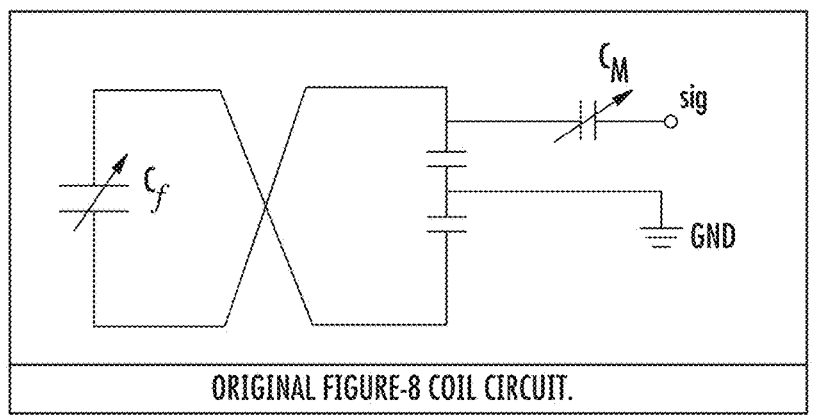
FIG. 1 is a schematic illustration of a prior art figure-8 RF coil circuit.

For the purposes of promoting an understanding of the principles of the present disclosure, reference will now be made to preferred embodiments and specific language will be used to describe the same. It will nevertheless be understood that no limitation of the scope of the disclosure is thereby intended, such alteration and further modifications of the disclosure as illustrated herein, being contemplated as would normally occur to one skilled in the art to which the disclosure relates.

Articles "a" and "an" are used herein to refer to one or to more than one (i.e. at least one) of the grammatical object of the article. By way of example, "an element" means at least one element and can include more than one element.

Unless otherwise defined, all technical terms used herein have the same meaning as commonly understood by one of ordinary skill in the art to which this disclosure belongs.

In magnetic resonance imaging (MRI), a set of radiofrequency (RF) coils can be used to transmit and receive the signal in parallel through multiple channels. Such coils may further be used in combination with special acquisition and reconstruction techniques based on parallel transmit and/or receive to improve the homogeneity of the RF magnetic field $B_1$ (RF shimming or $B_1$ shimming) or to reduce the scan time (parallel imaging), respectively. In addition, a separate set of coils can be used to generate a non-uniform magnetic field designed to compensate for any inhomogeneities of the static magnetic field $B_0$ (active $B_0$ shimming).

Thus, existing technologies use one set of RF coils for parallel transmit/receive and a separate set of shim coils for $B_0$ shimming. Embodiments of the present invention are directed to the integration of parallel transmit/receive and $B_0$ shimming into the same set of coils. This provides a number of advantages over existing technologies. First, by eliminating the need to use separate local shim coils, which otherwise need to be placed in the proximity of the imaging object to achieve an effective high-order shimming, it can save valuable space within the MRI magnet bore, while still providing an optimized localized $B_0$ shimming. Second, by simplifying the scanner design and/or reducing the size of the magnet bore without any sacrifice in performance, it can largely reduce the manufacturing cost of MRI scanners. Third, in some embodiments, the use of a single set of coils for both transmit/receive and $B_0$ shimming, can avoid the electromagnetic interference issue between the outer RF coil array and the inner shim coil array (RF shielding) associated with existing technologies, which currently requires a large gap to be kept open in the middle of the shim coil array for the RF signal to go through, at the expense of the shimming performance, See, Juchem et al., supra., the contents of which are hereby incorporated by reference as if recited in full herein. Finally, this invention may be particularly useful for ultra-high field MRI (i.e., 7 Tesla and above), as it can address $B_0$ and $B_1$ inhomogeneity, both of which increase with field strength.

Figure 2:
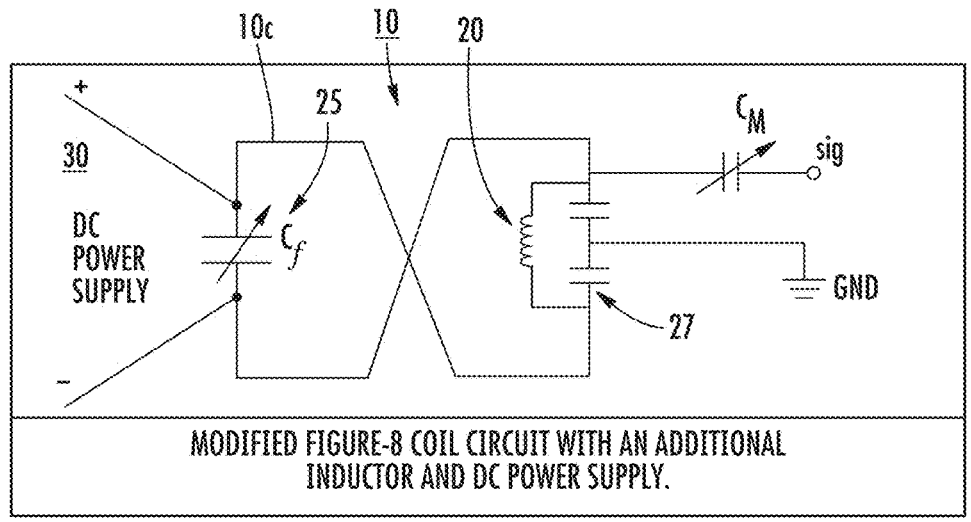
FIG. 2 is a schematic illustration of an example of an RF coil circuit contemplated by embodiments of the present invention.
Figure 3:
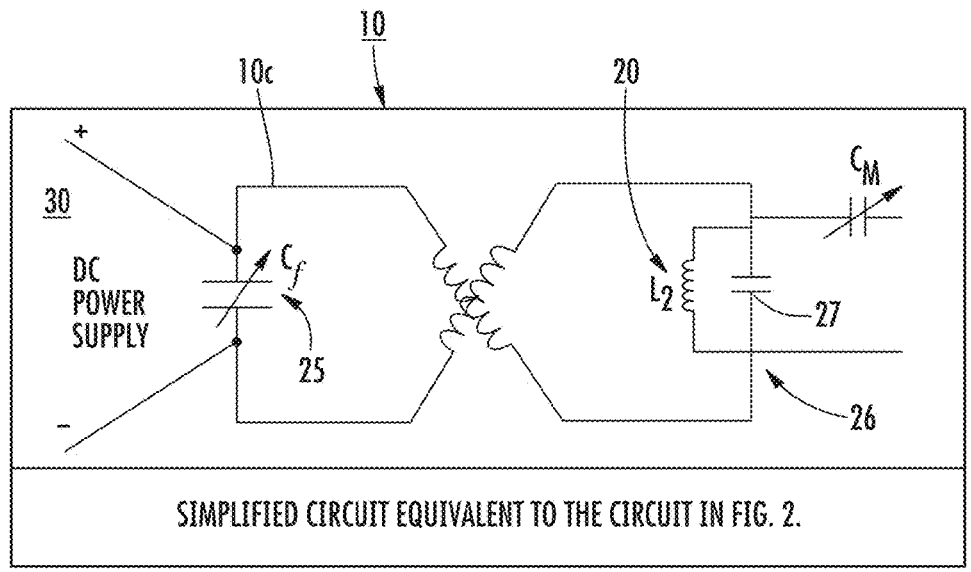
FIG. 3 is a schematic illustration of a simplified equivalent of the RF coil circuit shown in FIG. 2 according to embodiments of the present invention.
Figure 8:
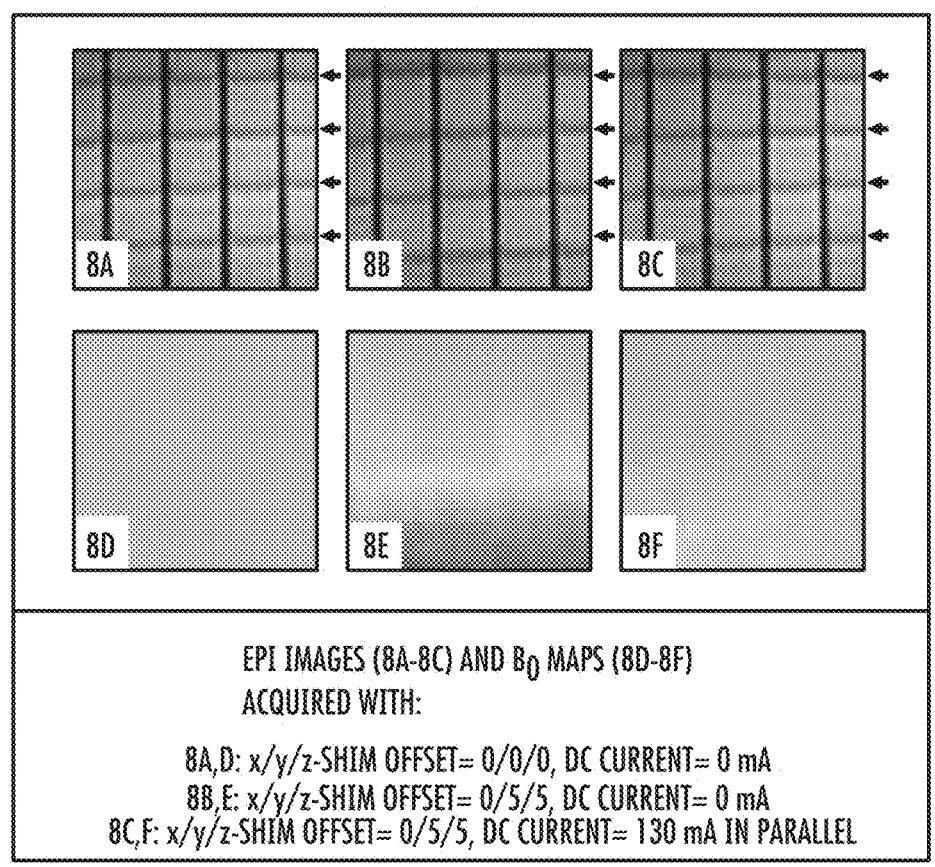
FIGS. 8A-8C are EPI images acquired with different shim offsets and/or DC current according to embodiments of the present invention.
FIGS. 8D-8F are $B_0$ maps acquired with corresponding shim offsets and/or DC current for corresponding panels of the EPI images of FIGS. 8A-8C according to embodiments of the present invention.

Two coil prototypes were designed and built based on a single-loop RF coil and a figure-8 loop RF coil. The original (prior art) circuit of the figure-8 coil is shown in FIG. 1. FIG. 2 illustrates an example of an RF coil 10 contemplated by embodiments of the invention. FIG. 3 illustrates simplified but equivalent circuit of the circuit shown in FIG. 2. The corresponding circuits for the single-loop coil are identical, except that there is no crossing in the center.

As shown in FIGS. 2 and 3, the inductor $L_2$ 20 (not in the original circuit of FIG. 1) forms a closed loop 10c and allows a DC current to flow in the coil 10 thereby generating an additional $B_0$ field that can be used for $B_0$ shimming. A DC power supply 30 is fed into the coil circuit 10c across the frequency-turning capacitor $C_f$ 25. As a result, both the RF and DC currents can flow in the same coil structure 10 simultaneously with no interference from each other.

With a parallel LC Circuit 26, (inductor 20 and capacitor 27), the figure-8 coil 10 becomes a dual-tuned RF coil with a high resonance frequency and a low resonance frequency. See, e.g., Ha et al., A PIN diode controlled dual-tuned MRI RF coil and phased array for multi-nuclear imaging, Phys. Med. Biol. 55 (2010), 2589-2600, the contents of which are hereby incorporated by reference as if recited in full herein.

In some embodiments, the inductor $L_2$ 20 can be chosen to be 10 times larger than the original inductance of the figure-8 coil, resulting in a low resonance frequency of 28 MHz and a high resonance frequency of 131 MHz, which is close to the original resonance frequency of 128 MHz (for a field strength of 3 Tesla) and makes it easy to tune and match the circuit. A similar design can also be applied to other types of coils.

In some embodiments, $L_2$ 20 is 2.6 pH. A high-power resistor, e.g., 8 ohm, can be inserted in the DC loop 10c since the coil resistance is only 0.06 ohm. In the prototype, a fuse with a 1 A maximum current was also inserted in the DC loop.

Figure 4:
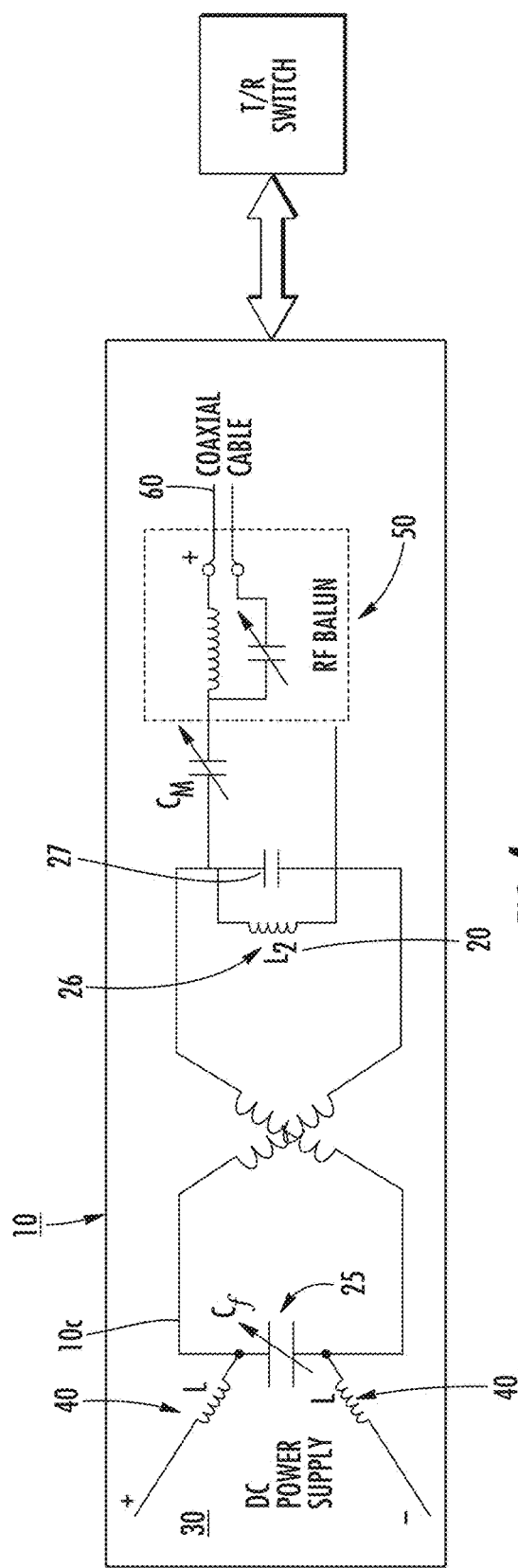
FIG. 4 is a schematic illustration of another example of an RF coil circuit, similar to that shown in FIG. 3, according to embodiments of the present invention.

FIGS. 2 and 3 only show one possible implementation of the invention. For example, in order to reduce the RF/electromagnetic coupling between the RF coils (of the RF coil array) and the MRI system environment, an RF balun 50 may be placed between the RF matching circuit of each coil 10 and the transmit/receive (T/R) switch as shown in FIG. 4. In addition, to prevent RF power from leaking through the extended DC loop 10c, two large-value inductors L 40 may be placed as RF chokes between the DC loop 10c of each coil and the DC power supply 30.

A full implementation of embodiments of the invention can include dedicated MRI hardware and software. In particular, a coil array 10A with multiple coils 10 should be used to provide the best results. To achieve an effective $B_0$ shimming, the type, geometry, and location of each coil should be optimized and the amplitude and timing of the DC current in each coil should be individually adjusted. See, e.g., Juchem C, Brown P B, Nixon T W, McIntyre S, Boer V O, Rothman D L, de Graaf R A. Dynamic multi-coil shimming of the human brain at 7 T. J Magn Reson 2011; 212:280-288; and Pan et al., Role of very high order and degree $B_0$ shimming for spectroscopic imaging of the human brain at 7 Tesla, Mag. Res. In Med. 2011 Dec. 28, doi: 10.1002/mrm.24122, the contents of which are hereby incorporated by reference as if recited in full herein.

If available, the spherical harmonic shim coils integrated in the MRI scanner can further be used as additional degrees of freedom for $B_0$ shimming. To achieve an effective $B_1$ shimming, the amplitude, phase, timing, and frequency characteristics of the RF current in each coil element should also be independently adjusted. See, e.g., U.S. Pat. Nos. 7,598,739 and 7,800,368, the contents of which are hereby incorporated by reference as if recited in full herein The commercial design involving both DC and RF aspects of the RF coil array can be considered together in order to optimize the $B_0$ and $B_1$ fields and/or to address a specific imaging problem.

Embodiments of the invention will be disused further below with reference to the following non-limiting examples.

EXAMPLES

Experiment 1

Goal:
Experiment 1 was performed to demonstrate that both the RF mode and DC mode of the modified figure-8 coil can be used simultaneously for transmit/receive and for generating an additional non-uniform $B_0$ field, respectively.

Methods:

Coronal images of a spherical water phantom were acquired on a GE 3T MRI scanner with a gradient-echo single-shot echo-planar imaging (EPI) sequence and the following parameters: repetition time (TR)=2 s, echo time (TE)=31 or 32 ms, flip angle=60°, field-of-view (FOV)=15× 15 cm, matrix size=64×64, slice thickness=4 mm, and frequency direction=right/left (R/L). The coil was positioned in the coronal plane on top of the phantom with the two halves of the figure-8 in the R/L direction. $B_0$ maps were computed from the phase images acquired at both TEs. $C_M$ and $C_f$ were both adjustable capacitors with a range of 0-10 pf and the two capacitors were about 12 pf.

Figure 5:
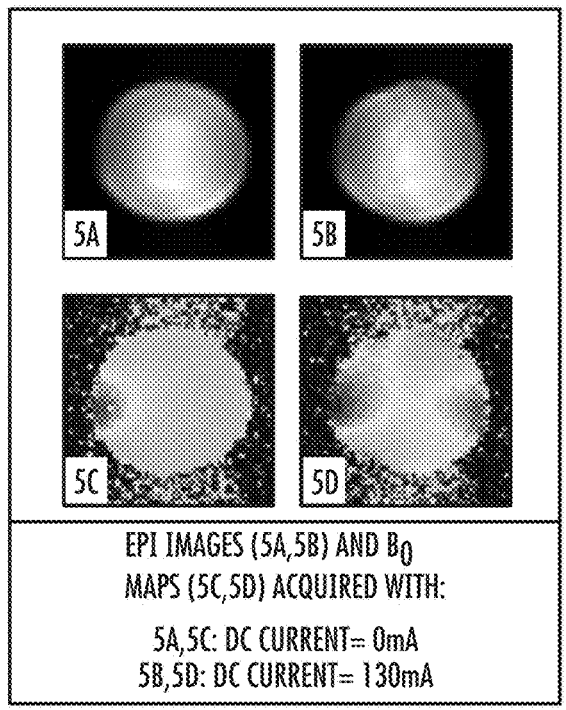
FIGS. 5A and 5B are EPI images acquired with DC current and without DC current, respectively.
FIGS. 5C and 5D are color $B_0$ maps acquired with DC current and without DC current, respectively.

Results:

FIG. 5 shows representative EPI images and $B_0$ maps acquired with a DC current of 0 or 130 mA. Without DC current, the $B_0$ map is mostly uniform (except for a small region on the left) (c) and the EPI image has no geometric distortions (a). When the DC current is turned on, the $B_0$ map becomes more inhomogeneous because of the additional $B_0$ field generated by the DC current (d) and the EPI image is affected by large geometric distortions (b).

Conclusion:

These results demonstrate that both the RF and DC modes of the modified figure-8 coil can work simultaneously.

Experiment 2

Goal:

Experiment 2 was performed to measure the $B_0$ field generated by the DC mode of the modified single-loop and figure-8 coils. These $B_0$ maps will be used in subsequent experiments to determine the optimal DC currents to be applied in each coil for $B_0$ shimming.

Methods:

Coronal 80 maps of a water phantom were acquired with a gradient-echo sequence and TR=1 s. TE=4.7 or 5.7 ms, flip angle=60°, FOV=22.5×22.5 cm, matrix size=128×128, and slice thickness=4 mm. The coils were positioned in a coronal plane on top of the phantom and a DC current of 130 mA was applied in one coil at a time. High-order shimming was first performed (without DC current) to obtain a uniform $B_0$ field. In addition, $B_0$ maps were also numerically simulated by using the Biot-Savart law for a single-loop coil and a figure-8 coil with an identical geometry and orientation as in the experiments.

Figure 6:
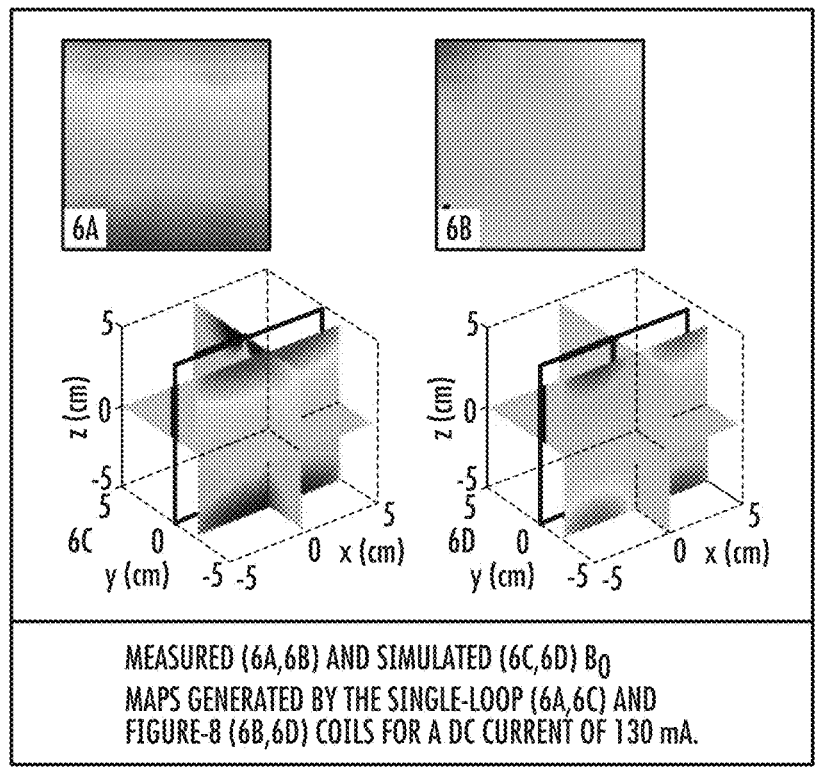
FIGS. 6A and 6B are measured $B_0$ maps and FIGS. 6C and 6D are simulated $B_0$ maps generated by the single-loop (FIGS. 6A, 6C) and figure-8 loop (FIGS. 6B, 6D) coils for a DC current of 130 mA according to embodiments of the present invention.

Results and Discussion:

FIG. 6 shows the measured and simulated $B_0$ maps for both coils. These results demonstrate that the single-loop and figure-8 coils both generate a non-uniform $B_0$ field, but with a very different spatial pattern, which can be used for $B_0$ shimming. Furthermore, there is generally a good agreement between the measured and simulated $B_0$ maps for both coils. The small asymmetry in (b) may be due to the fact that the figure-8 coil was slightly tilted with respect to the imaging plane.

Experiment 3

Goal:

Experiment 3 was performed to demonstrate that the DC mode of the modified figure-8 coil can actually be used for $B_0$ shimming, i.e., to reduce the $B_0$ inhomogeneity and improve the image quality.

Methods:

Coronal images of a square water phantom containing a grid were acquired with a spin-echo single-shot EPI sequence and TR=2 s, TE=60 ms, FOV=20×20 cm, matrix size=128×128, slice thickness=4 mm, and frequency direction=R/L. The coil was positioned as in Experiment 2. High-order shimming was first performed (without DC current) to obtain a uniform $B_0$ field.

Figure 7:
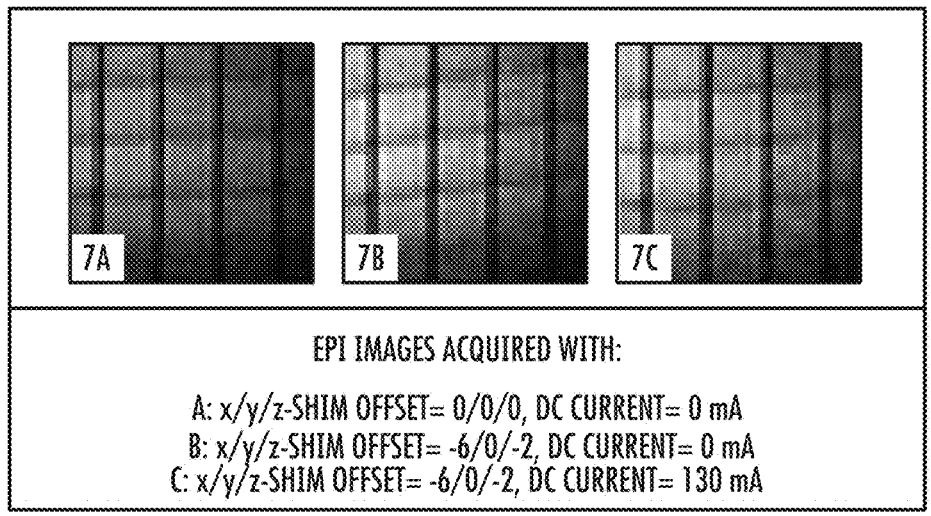
FIGS. 7A-7C are EPI images acquired with different shim offsets and/or DC current according to embodiments of the present invention.

Results:

FIG. 7 shows representative EPI images (cropped to a 6×6 cm region-of-interest (ROI)) acquired under three different conditions. First, an image was acquired without DC current, resulting in minimal geometric distortions (a). Second, a $B_0$ field inhomogeneity was deliberately introduced by offsetting the linear x-shim (R/L) by −6 (arbitrary units) and the linear z-shim (superior/inferior (S/1)) by −2, resulting in a shearing and stretching of the EPI image (b). Third, an optimal DC current of a 130 mA was applied to generate an additional $B_0$ field and compensate for the $B_0$ inhomogeneity introduced by the shim offsets in the ROI, resulting in a significant reduction of the geometric distortions in the EPI image (c).

Conclusion:

These results demonstrate that the modified figure-8 coil can be used for simultaneous transmit, receive, and $B_0$ shimming. Although there are still some residual distortions because this proof-of-concept experiment was performed with only one coil, which offers a relatively limited flexibility for shimming, a more effective shimming can be achieved by using multiple coils, as shown in Experiment 4.

Experiment 4

Goal:

Experiment 4 was performed to demonstrate that the modified single-loop and figure-8 coils can be used simultaneously, each with an RF and a DC mode, for parallel transmit, receive, and $B_0$ shimming.

Methods:

This experiment was identical to Experiment 3, except that the single-loop coil was added directly underneath the figure-8 coil. The DC loops of both coils were connected in parallel to the DC power supply. EPI images were acquired as in Experiment 3, but with FOV=22.5×22.5 cm and matrix size=192×192. $B_0$ maps were acquired as in Experiment 2, Since our scanner does not have parallel transmit capability, the data were acquired sequentially by exciting only one coil at a time. The EPI images from both coils were combined by using the square root of the sum of squares, while the $B_0$ maps from both coils were averaged.

Results:

FIG. 8 shows representative EPI images and $B_0$ maps (cropped to a 6×6 cm ROI) acquired under three different conditions. First, an image was acquired without DC current, resulting in minimal geometric distortions (a). Second, a $B_0$ field inhomogeneity was deliberately introduced by offsetting the linear y-shim (anterior/posterior) by +5, resulting in a global L $B_0$ offset and a linear $B_0$ gradient along z in the $B_0$ map (e) as well as a stretching of the EPI image (b). Third, an optimal DC current of 130 mA was applied in parallel in both coils to generate an additional $B_0$ field and compensate for the $B_0$ inhomogeneity introduced by the shim offsets in the ROI, resulting in a significant reduction of the $B_0$ inhomogeneity in the $B_0$ map (f) and of the geometric distortions in the EPI image (c).

Conclusion:

These results demonstrate that the modified single-loop and figure-8 coils can be used for simultaneous parallel transmit, receive, and $B_0$ shimming.

Experiment 5

Goal: Experiment 5 was performed to demonstrate that the DC current in each coil can be individually adjusted, thereby introducing an additional degree of freedom to improve the $B_0$ shimming.

Methods:

This experiment was identical to Experiment 4, except that the relative ratio of the DC currents in both coils was adjusted by inserting resistors with different values into the two DC loops. Furthermore, EPI images were also acquired with frequency direction=S/1 in addition to R/L.

Figure 9:
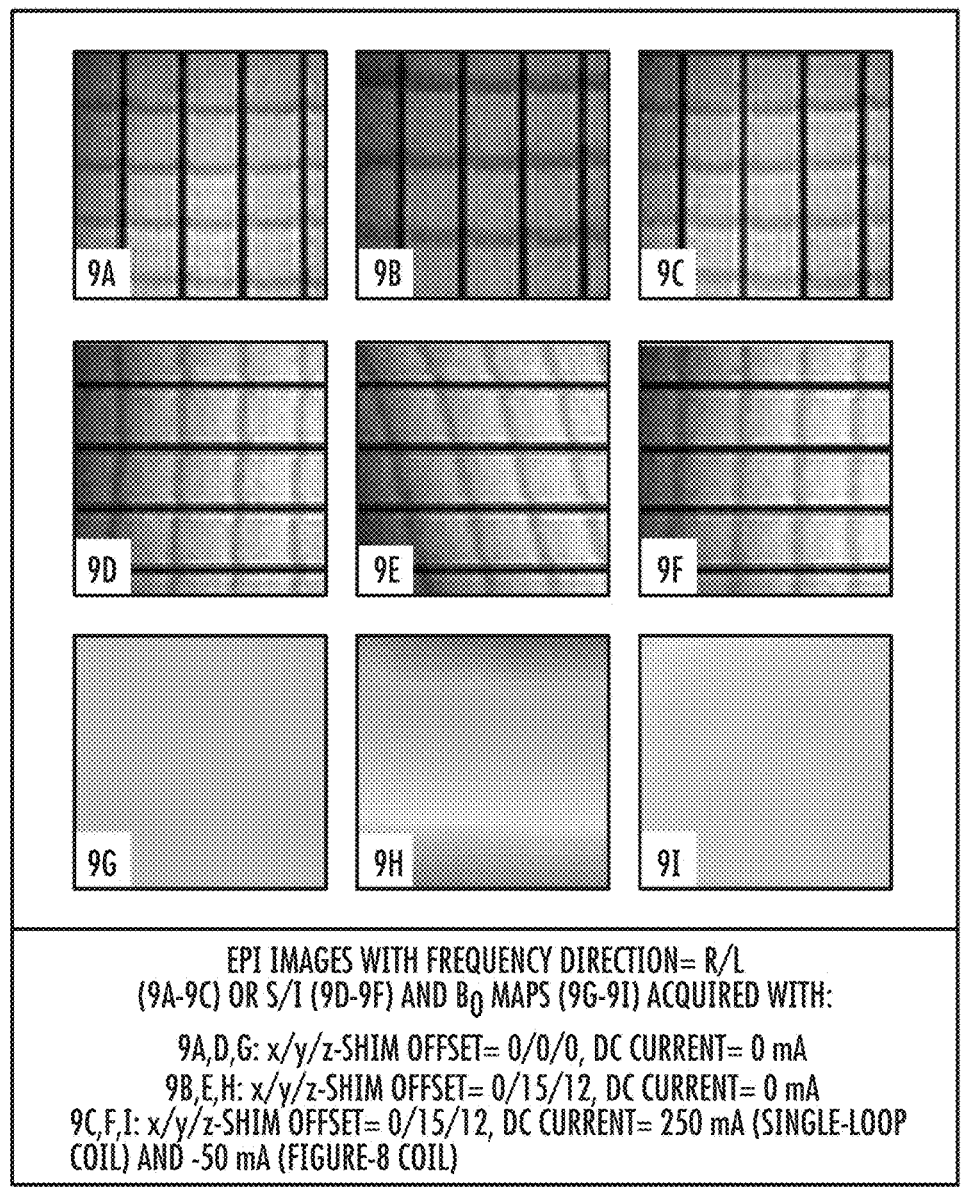
FIGS. 9A-9F are EPI images with frequency direction R/L (FIGS. 9A-9C) or S/I (FIGS. 9D-9F) and $B_0$ maps (FIGS. 9G-9I) for various shim offsets and DC current values according to embodiments of the present invention.

Results:

FIG. 9 shows representative EPI images and $B_0$ maps (cropped to a 6×6 cm ROI) acquired under three different conditions. First, images were acquired without DC current, resulting in minimal geometric distortions (a, d). Second, a $B_0$ field inhomogeneity was deliberately introduced by off-setting the linear y-shim by +15 and the linear z-shim by +12, resulting in a global $B_0$ offset and a linear $B_0$ gradient along z in the $B_0$ map (h), as well as a stretching (b) or shearing (e) of the EPI images. Third, individually optimized DC currents of 250 mA and −50 mA were applied in the single-loop and figure-8 coils respectively to generate an additional $B_0$ field and compensate for the $B_0$ inhomogeneity introduced by the shim offsets in the ROI, resulting in a significant reduction of the $B_0$ inhomogeneity in the $B_0$ map (i) and of the geometric distortions in the EPI images (c, f). The negative current in the figure-8 coil indicates that it flows in an opposite direction as compared to Experiments 1-4.

Conclusion:

These results demonstrate that the DC current in each coil can be individually optimized to improve the $B_0$ shimming.

Any patents or publications mentioned in this specification are indicative of the levels of those skilled in the art to which the invention pertains. These patents and publications are herein incorporated by reference to the same extent as if each individual publication was specifically and individually indicated to be incorporated by reference. In case of conflict, the present specification, including definitions, will control.

One skilled in the art will readily appreciate that the present invention is well adapted to carry out the objects and obtain the ends and advantages mentioned, as well as those inherent therein. The present disclosure described herein are presently representative of preferred embodiments, are exemplary, and are not intended as limitations on the scope of the invention. Changes therein and other uses will occur to those skilled in the art which are encompassed within the spirit of the invention as defined by the scope of the claims.

We claim:

1. An RF coil system configured for an Magnetic Resonance Imaging (MRI) system, comprising:
   a coil array with multiple coil elements or multiple transverse electromagnetic (TEM) elements, wherein the multiple coil elements or multiple TEM elements have direct current (DC) loops and are simultaneously operative in both:
   (i) an RF mode that performs at least one of RF transmit or RF receive; and
   (ii) a DC mode where DC current flows in the DC loops in order to generate local $B_0$ magnetic fields as a source of $B_0$ shimming, and
   wherein the MRI system is configured to perform the $B_0$ shimming using the generated local $B_0$ magnetic fields.

2. The system of claim 1, wherein a respective DC loop of the multiple coil elements or the multiple TEM elements is connected to a DC power supply that feeds the DC current into the respective DC loop.

3. The system of claim 2 wherein positive and negative connections of the DC power supply are connected to the respective DC loop across a capacitor.

4. The system of claim 2, wherein the respective DC loop comprises an inductor associated with a parallel inductor capacitor (LC) resonant circuit whereby when DC current flows through the inductor of the LC resonant circuit current is circulated in the respective DC loop.

5. The system of claim 1, wherein the coil array with the multiple coil elements or the multiple TEM elements is configured as a single RF coil array that is configured for parallel transmit and parallel receive while also performing $B_1$ shimming using at least one RF signal provided by either the multiple coil elements or the multiple TEM elements being used concurrently with generating the local $B_0$ magnetic as the source of the $B_0$ shimming by the MRI system during transmit and receive operations.

6. The system of claim 1, wherein the coil array with the multiple coil elements or the multiple TEM elements is configured as two separate coil arrays used together and the coil elements from both of the separate coil arrays when used together comprise the DC loops that generate the local $B_0$ magnetic fields that are used for $B_0$ shimming in the MRI system.

7. The system of claim 1, further comprising at least one DC power supply coupled to the multiple coil elements or the multiple TEM elements, wherein the MRI system is configured to control the at least one DC power supply in order to individually adjust DC current within one or more of the multiple coil elements or the multiple TEM elements.

8. The system of claim 1, wherein the DC loops of the multiple coil elements or the multiple TEM elements in the coil array have a closed loop shape and a dual RF coil tuning that functions with high and low resonant frequencies.

9. A method of shimming Magnetic Resonance (MR) systems, comprising:
   providing the MR system with an RF coil array or an RF coil comprising a plurality of coil elements or a plurality of transverse electromagnetic (TEM) elements, wherein each of the plurality of coil elements or the plurality of TEM elements has an associated circuit with a direct current (DC) current loop;
   flowing DC current through the DC current loops of the plurality of coil elements or the plurality of TEM elements during operation of a transmit and/or receive mode of the MR system;
   generating local $B_0$ magnetic fields within the MR system in response to the flow of the DC current through the DC current loops that comprise the plurality of the coil elements or the plurality of the TEM elements; and
   performing a $B_0$ shimming of the MR system with using the generated local $B_0$ fields during the transmit and/or receive mode that acquires MR image data.

10. The method of claim 9, the method further comprising flowing RF current through the plurality of coil elements or the plurality of TEM elements while the DC current flows in each of the DC current loops of the plurality of coil elements or the plurality of TEM elements simultaneously and independently without electromagnetic interference between the DC current and the RF current while performing the $B_0$ shimming with either the RF coil array or the RF coil.

11. The method of claim 9, further comprising also performing $B_1$ shimming using the provided RF coil or RF coil array, with at least one RF signal being provided by the multiple coil elements or the multiple TEM elements concurrently while flowing DC current through the DC loops and generating the local $B_0$ magnetic fields as the source of the $B_0$ shimming of the MRI system during transmit and/or receive operations.

12. The method of claim 9, wherein the provided RF coil array or the RF coil is a single RF coil comprising either the plurality of coil elements or the plurality of the TEM elements.

13. The method of claim 9, wherein the provided RF coil array or the RF coil includes first and second separate RF coil arrays, each comprising the plurality of coil elements or the plurality of TEM elements with the DC current loops, and wherein the flowing and generating steps are carried out to generate the local $B_0$ magnetic fields from the first and second separate RF coil arrays, and wherein the $B_0$ shimming is performed with the generated local $B_0$ magnetic fields obtained from the first and second separate RF coil arrays.

14. The method of claim 9, wherein the $B_0$ shimming includes individually controlling DC current in each of the plurality of coil elements or the plurality of TEM elements with at least one power source that is configured to individually adjust current for each of the DC loops of the plurality of coil elements or the plurality of TEM elements.

15. The method of claim 9, wherein the plurality of coil elements or the plurality of the TEM elements define the RF coil array.

16. An RF coil assembly configured for a Magnetic Resonance Imaging (MRI) system, comprising:
at least one RF coil array with a plurality of coil elements or a plurality of TEM elements, wherein a respective coil element or a respective TEM element comprises a circuit, the circuit comprising:
a DC current loop;
a DC power supply;
a first capacitor coupled to the DC power supply, wherein the DC power supply is outside the DC current loop and feeds the circuit across the first capacitor, and wherein the first capacitor is located in the DC current loop;
an RF choke residing in series between the DC current loop and each of a positive and negative input of the DC power supply; and
a parallel inductor and a second capacitor that together define an (LC) resonant circuit component with the inductor of the LC resonant circuit component also being part of the DC current loop,
wherein, in operation, DC current flows through the inductor of the LC resonant circuit component within the DC current loop in order to generate a local $B_0$ magnetic field, and wherein the RF coil assembly is configured to provide both (i) an RF mode that performs at least one of transmitting or receiving and (ii) a direct current (DC) mode in order to generate local $B_0$ magnetic fields that are used by the MRI system when performing $B_0$ shimming, and wherein both of the RF and DC modes work simultaneously.

17. The RF coil assembly of claim 16, wherein the circuit is configured to control the DC power supply in order to individually adjust DC current in the plurality of the coil elements or the plurality of the TEM elements.

18. The RF coil assembly of claim 16, wherein the RF coil assembly includes first and second RF coil arrays with the respective coil element or the respective TEM element, and wherein the respective coil element or the respective TEM element of the first and second RF coil arrays both comprise the circuit with the DC current loop and are configured to flow DC current to generate the local magnetic $B_0$ fields that are used by the MRI system when performing the $B_0$ shimming.

19. The RF coil assembly of claim 16, wherein the respective coil element or the respective TEM element has a closed DC loop shape as the DC current loop, and wherein the respective coil element or the respective TEM element has a dual RF coil tuning that functions with high and low resonant frequencies.

20. The RF coil assembly of claim 16,
wherein the at least one RF coil array is a single RF coil array configured as an integrated parallel transmit, parallel receive RF coil array that also performs $B_0$ and $B_1$ shimming concurrently with the performing of the transmitting and/or receiving,
wherein the $B_1$ shimming is performed by the MRI system using at least one RF signal provided by the multiple coil elements or the multiple TEM elements as the source of $B_1$ shimming,
wherein the $B_0$ shimming is performed by the MRI system by using the generated local $B_0$ magnetic fields obtained during the transmitting and/or receiving as the source of $B_0$ shimming, and
wherein both the $B_0$ and $B_1$ shimming occur concurrently with one another, when the at least one RF coil array is utilized by the MRI system.

* * * * *

UNITED STATES PATENT AND TRADEMARK OFFICE
CERTIFICATE OF CORRECTION

PATENT NO. : 9,864,025 B2
APPLICATION NO. : 13/898993
DATED : January 9, 2018
INVENTOR(S) : Han et al.

It is certified that error appears in the above-identified patent and that said Letters Patent is hereby corrected as shown below:

In the Specification

Column 4, Line 11: Please correct "2.6 pH" to read -- 2.6 µH --

Signed and Sealed this
Twenty-fourth Day of July, 2018

Andrei Iancu
*Director of the United States Patent and Trademark Office*